United States Patent [19]
Jang

[11] Patent Number: 5,882,966
[45] Date of Patent: Mar. 16, 1999

[54] BIDMOS SEMICONDUCTOR DEVICE AND METHOD OF FABRICATING THE SAME

[75] Inventor: Young-Soo Jang, Kyungki-do, Rep. of Korea

[73] Assignee: Samsung Electronics Co., Ltd., Suwon, Rep. of Korea

[21] Appl. No.: 721,093

[22] Filed: Sep. 27, 1996

[30] Foreign Application Priority Data

Sep. 30, 1995 [KR] Rep. of Korea .................. 1995-33419

[51] Int. Cl.⁶ .................. H01L 21/8249; H01L 21/8238; H01L 21/336
[52] U.S. Cl. ..................... 438/234; 438/212; 438/272
[58] Field of Search ..................... 438/202, 206, 438/209, 212, 213, 234, 268, 270, 271, 272, 273, 274; 257/586, 378, 577

[56] References Cited

U.S. PATENT DOCUMENTS

| | | | |
|---|---|---|---|
| 4,048,649 | 9/1977 | Bohn | 357/43 |
| 5,679,972 | 10/1997 | Kim | 257/378 |

*Primary Examiner*—Brian Dutton
*Attorney, Agent, or Firm*—William L. Geary, Jr.

[57] ABSTRACT

A BiDMOS device in which a bipolar transistor and a DMOS transistor are formed on the same substrate, thereby resulting in a high degree of integration, and a method of fabricating the same using a reduced number of process steps. A high voltage operating characteristic is achieved because the gate of the DMOS transistor isolates the base and collector of the bipolar transistor. In addition, the junction capacitance between the bipolar base and collector regions is considerably reduced due to the isolation provided by the DMOS gate polysilicon.

17 Claims, 3 Drawing Sheets

BIDMOS SEMICONDUCTOR DEVICE AND METHOD OF FABRICATING THE SAME

FIELD OF THE INVENTION

The present invention relates to a semiconductor device and a method of fabricating the same, and more particularly to a BiDMOS device in which a bipolar transistor and a DMOS (double diffused metal oxide semiconductor) transistor are formed in one layout, and a method of fabricating the same.

DESCRIPTION OF THE PRIOR ART

As is well known in the art, a bipolar transistor has an electrical characteristic in which the output current may be modulated by the base current while a MOS (metal oxide semiconductor) transistor has an electrical characteristic in which the output current may be modulated by the gate voltage.

In a conventional BiDMOS device in which both a bipolar transistor and a DMOS transistor are fabricated on the same semiconductor substrate, the bipolar transistor and the DMOS transistor are respectively formed in different layouts of the same semiconductor substrate. This causes many problems such as a reduced degree of integration and the need for additional processing. In addition, the manufacturing process must be optimized to satisfy the electrical characteristics of both bipolar and DMOS transistors on the same substrate, but it is quite difficult to accomplish the process optimization as is well-known in the art.

SUMMARY OF THE INVENTION

Accordingly, it is an object of the present invention to provide a semiconductor device in which a bipolar transistor and a DMOS transistor are formed in one layout with the result that the device has relatively high degree of integration, and a method of fabricating the same.

It is another object of the present invention to provide a semiconductor device in which the base and collector of a bipolar transistor may be sufficiently electrically isolated by the gate polysilicon of the DMOS transistor, thus obtaining a high voltage operation characteristic and leading to the reduction of junction capacitance between the base and the collector thereof, and a method of fabricating the same.

It is a further object of the present invention to provide a semiconductor device in which the gate of a DMOS transistor and the base of a bipolar transistor are electrically connected and a connection point therebetween is used as an input terminal of the device with the result that the output current thereof maybe modulated in response to either an input current or an input voltage through the input terminal.

According to an aspect of the present invention, the semiconductor device in which a bipolar transistor and a DMOS (double diffused MOS) transistor are formed on the same semiconductor substrate of a first conductivity type, comprises a collector layer buried in said substrate, having a second conductivity type; an epitaxial layer electrically isolated from the other devices by a device isolating layer and grown on said collector buried layer and said substrate, having said second conductivity type; a trench formed vertically in said epitaxial layer, having side wall and bottom; a gate oxide layer formed on said side wall and said bottom thereof; a gate polysilicon layer formed on said gate oxide layer, being filled into said trench; a base region formed at a side portion of said trench and on said epitaxial layer; a drain sink formed at the side portion of said trench and in contact with said collector buried layer, said drain sink passing through said epitaxial layer; and an emitter region formed on both said drain sink and said base region.

According to another aspect of the present invention, the method of fabricating a semiconductor device in which a bipolar transistor and a DMOS (double diffused MOS) transistor are formed on the same semiconductor substrate of a first conductivity type, comprises the steps of forming a buried layer and a device isolating layer which are isolated apart from each other, said buried layer having a second conductivity type and said device isolating layer having the first conductivity type; sequentially forming an epitaxial layer and a pad oxide layer on said substrate; patterning said pad oxide layer by photolithography to form a patterned oxide layer, forming a device isolation region of said first conductivity type by ion-implantation using said patterned oxide layer as a mask; defining a sink region by photolithography and injecting impurity-ions into said sink region to form a drain sink of the second conductivity type; forming a device isolating oxide layer at an inactive region by oxidation using a patterned nitride layer formed on said epitaxial layer as a mask; defining a base region by photolithography and injecting impurity-ions into said base region to form said base region of said first conductivity type; defining an emitter region by photolithography and injecting impurity-ions into said emitter region to form said emitter region of said second conductivity type; sequentially forming a nitride layer and a low-temperature oxide layer on both said pad oxide layer and said device isolating oxide layer; patterning said nitride layer and said low-temperature oxide layer to form a trench forming mask; selectively removing said substrate to form a trench having side wall and bottom therein; forming a gate oxide layer on both side wall and said bottom; filling a polysilicon layer into said trench to form a gate polysilicon layer; forming metal contact regions by photolithography; and performing a metallization to form metal electrodes on said metal contact regions.

BRIEF DESCRIPTION OF THE DRAWINGS

This invention may be better understood and its objects will become apparent to those skilled in the art by reference to the accompanying drawings as follows.

DETAILED DESCRIPTION OF THE PREFERRED EMBODIMENTS

Figure 1:
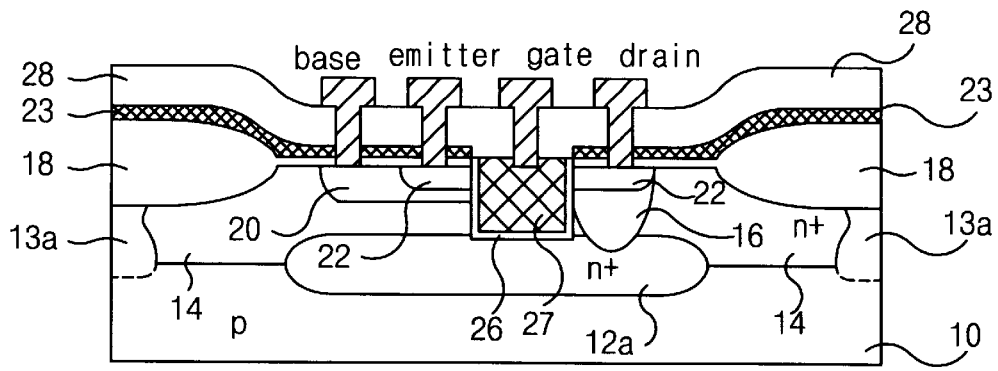
FIG. 1 is a cross-sectional view showing the structure of a semiconductor device fabricated by a novel method of the present invention.

Referring to FIG. 1, a novel BiDMOS semiconductor device in accordance with the present invention comprises a n+ type collector buried later 12a formed on a p type semiconductor substrate 10, an n+ epitaxial layer 14 formed on the collector buried layer 12a and the semiconductor substrate, being isolated by a device isolation region 13a, a trench formed in the epitaxial layer 14, a gate oxide layer 26 formed along the side wall and the bottom of the trench, a gate polysilicon layer 27 formed on the gate oxide layer 26 in the trench, a base region 20 formed on the epitaxial layer 14, being on one side of the trench, a drain sink 16 formed in partial contact with the top surface of the buried 12a through the epitaxial layer 14, being formed on the other side of the trench, an emitter region 22 formed on the upper part of the drain sink 16 and on the base region 20. In the semiconductor device, both a bipolar transistor and a DMOS transistor are formed on the same semiconductor substrate.

The BiDMOS device may have a high voltage operating characteristic, and the junction capacitance between the base and collector regions may be considerably reduced, because the base region 20 and the collector region 12a of the bipolar transistor are sufficiently separated from each other by the gate polysilicon layer 27. Moreover, if the gate of the DMOS transistor and the base of the bipolar transistor in the BiDMOS device are electrically connected and a connection point therebetween is used as an input terminal of the device, the output current thereof may be modulated in response to either an input current or an input voltage.

Hereinafter, the method of fabricating the semiconductor device of FIG. 1 will be described in detail with reference to FIGS. 2A through 2I.

Figure 2A:
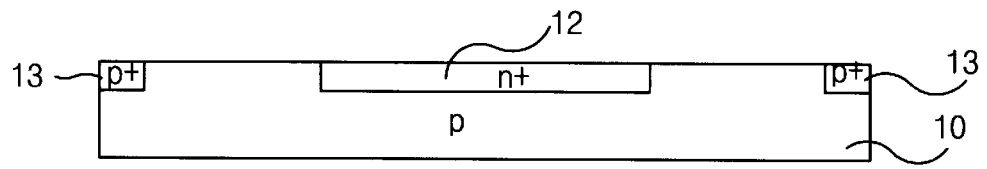
FIGS. 2A through 2I are process flow diagrams illustrating by sequential cross-sectional representations the process steps of the novel methods of fabricating the semiconductor device shown in FIG. 1.

Referring to FIG. 2A, on a p type semiconductor substrate 10, an n+ type primary collector buried layer 12 and a p+ type device isolation layer 13 are sequentially formed by impurity injection, which is well-known in the art.

Figure 2B:
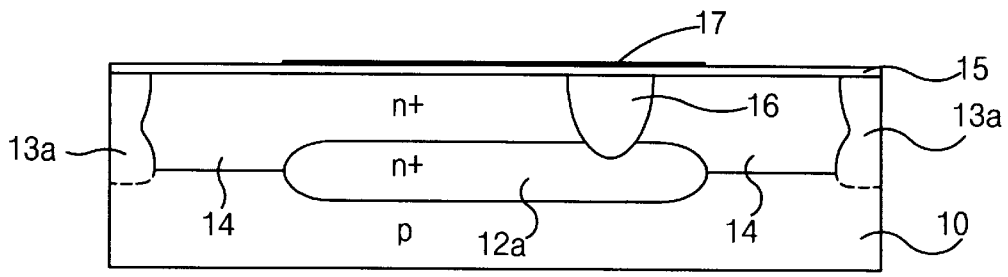

As shown in FIG. 2B, an n+ type epitaxial layer 14 is grown on the substrate 10, and then a pad oxide layer 15 is formed by oxidation. Boron-ion implantation using a patterned photoresist layer (not shown) as a mask is performed at a dosage between 1E15 and 8E15 ions/cm$^2$ using an implant energy of approximately 30 to 100 KEV, so that boron ions are injected into the epitaxial layer 14 through windows of the patterned photoresist layer, and thus a device isolation region 13a is formed. The epitaxial layer 14 has a resistivity of about 0.5 to 4.0 Ω/cm and has a thickness in the range of about 5 to 20 μm. The pad oxide layer 15 has a thickness in the range of about 500 to 1000 Å.

The impurity ions of the p+ type device isolation layer 13 are diffused into the epitaxial layer 14 during the growth of epitaxial 14, thereby forming a device isolation area 13a, as shown in FIG. 2B. During the growth of epitaxial layer 14, the impurity ions of the primary buried collector layer 12 also are diffused therein to form a collector buried layer 12a having the profile shown in FIG. 2B. The collector buried layer 12a functions as the collector electrode of a bipolar transistor.

Referring again to FIG. 2B, after the removal of the patterned photoresist layer used as the boron implant mask (not shown), a phosphorous-ion implantation using another patterned photoresist layer (not shown) as a mask for forming a sink region is performed at a dosage between 1E15 and 8E15 ions/cm$^2$ using an implant energy of approximately 30 to 100 KEV, so that phosphorous ions are injected into the epitaxial layer 14 through a window of the patterned photoresist layer. The phosphorous ions are diffused in the epitaxial layer 14 by a thermal treatment to form a drain sink 16 down into the buried collector layer 12a, as shown in FIG. 2B. Then, a nitride layer 17 having a thickness of about 500 to 1500 Å is formed and patterned on the pad oxide layer 15 and used as a mask to define an active region and a field region.

Figure 2C:
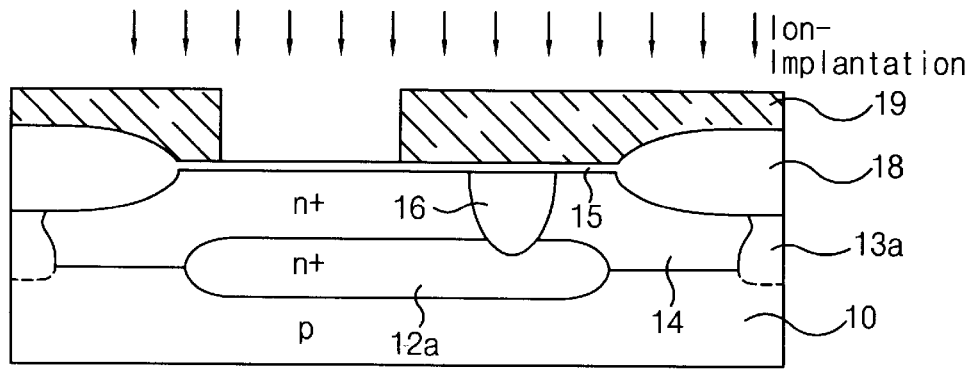

In FIG. 2C, a LOCOS (local oxidation of silicon) process using the patterned nitride layer as a mask is performed, and a LOCOS oxide layer 18 having a thickness of about 5000 to 9000 Å is formed on the field region. After the removal of the nitride layer 17, a photoresist layer 19 is formed and patterned on the LOCOS oxide layer 18 and the pad oxide layer 15. Boron-ion implantation using the patterned photoresist layer 19 as a base-forming mask is performed at a dosage between about 1E14 and 9E14 ions/cm$^2$ using an implant energy of about 30 to 70 KEV, so that boron ions are injected into the epitaxial layer 14. Thus, a base region 20 is formed on the epitaxial layer 14, as shown in FIG. 2D.

Figure 2D:
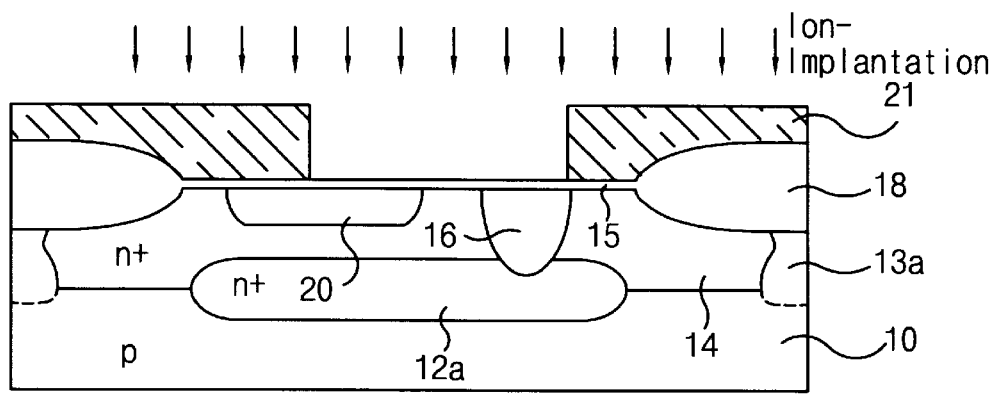

In FIG. 2D, after the removal of the photoresist layer 19, a photoresist layer 21 is formed and patterned on the pad oxide layer 15 and LOCOS oxide layer 18. Ion implantation using the patterned photoresist layer 21 as an emitter forming mask is performed at a dosage between about 5E14 and 9E15 ions/cm$^2$ using an implant energy of about 40 to 100 KEV, so that arsenic ions or phosphorous ions are injected into the epitaxial layer 14. Thus, an emitter region 22 is formed, partially overlapping the base region 20 and the sink 16, as shown in FIG. 2E.

Figure 2E:
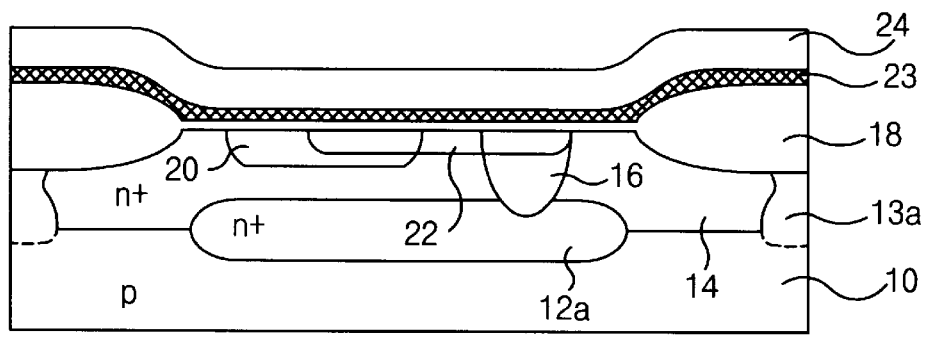

In FIG. 2E, after removal of the photoresist layer 21, a nitride layer 23 having a thickness of about 500 to 1500 Å is deposited on the oxide layers 15 and 18. Then, a thermal treatment is performed to diffuse the impurity ions into the epitaxial layer 14 and to completely form the base and emitter regions 20 and 22. Next, a low-temperature oxide layer 24 having a thickness of about 3000 to 7000 Å is formed on the nitride layer 23.

Figure 2F:
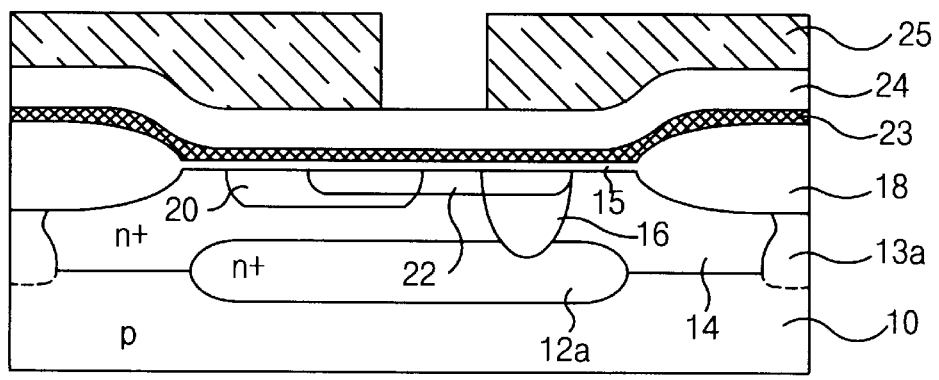
Figure 2G:
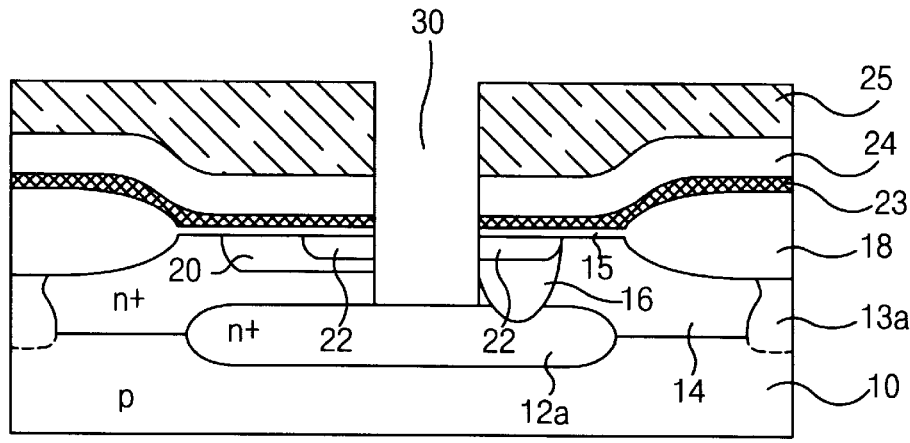

As shown in FIGS. 2F and 2G, a photoresist layer 25 is deposited and patterned on the low-temperature oxide layer 24 to form a window for defining a gate region. Then, a selective etching-process uses the pattern to selectivity remove the oxide layer 24, the nitride layer 23, the pad oxide layer 15, and the epitaxial layer 14, until the top surface of the collector buried layer 12a is exposed, as shown in FIG. 2G. As a result, a trench 30 is formed. After the etching process, a sacrificial oxide layer having a thickness of about 500–1000 Å (not shown) may be grown and removed on the bottom and sidewalls of the trench 30, to remove chemical impurities that may have resulted from the etching process.

Figure 2H:
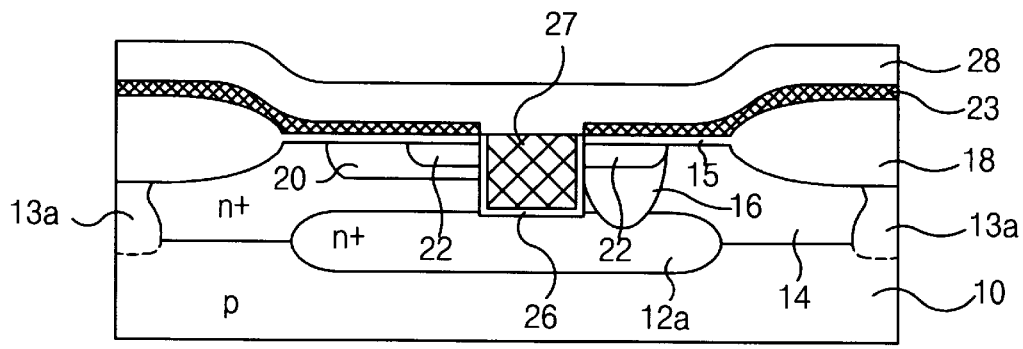

In FIG. 2H, a gate oxide layer 26 is formed on both the sidewalls and bottom of the trench 30, and a polysilicon deposition, such as using POCl$_3$, is performed so that a polysilicon material fills up the trench. As a result, a gate polysilicon layer 27 covers the oxide layer 24, and gate polysilicon 27 having a sheet resistance of about 20–150 Ω/cm$^2$ is formed in the trench.

A polishing process is performed to remove the polysilicon layer which is deposited on the oxide layer 24. The polishing process removes the polysilicon layer 27 which is deposited on the oxide layer 24, and it removes the oxide layer 24 down to nitride layer 23. Then, a low-temperature oxide layer 28 is formed on the nitride layer 23, covering the gate polysilicon layer 27 which remains in the trench 30, as shown in FIG. 2H.

Figure 2I:
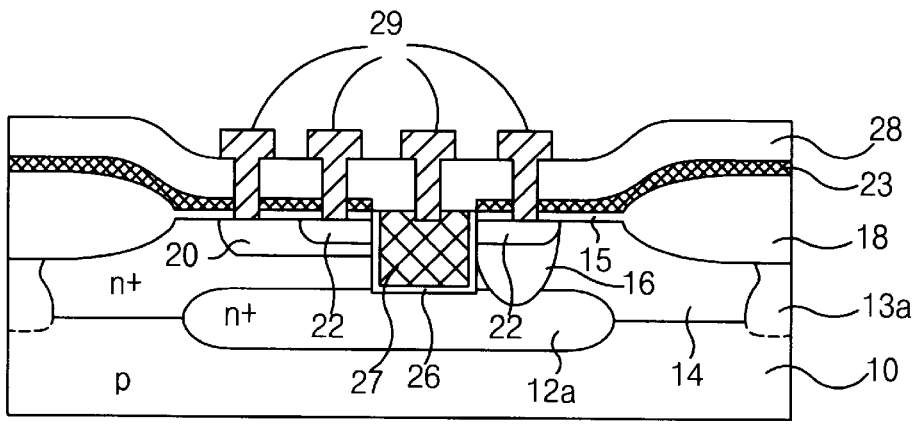

Finally, as shown in FIG. 2I, contact holes are formed by a photolithography and etching process, and metallization is performed to form metal electrodes 29 which are electrically in contact with the base 20, the emitter 22, the gate 27 and the drain region 16.

As described above, according to the semiconductor device which is fabricated by a novel method of the present invention, a bipolar transistor and a trench DMOS transistor can be formed in one layout. As a result, the semiconductor device has a relatively high degree of integration, as compared with a conventional BiDMOS device in which bipolar and DMOS transistors are formed in different layouts.

In the BiDMOS device of the invention, the base and collector of the bipolar transistor are sufficiently isolated by the gate of the DMOS transistor, and it is not necessary to intentionally extend the distance between base and collector thereof in order to achieve a high voltage operating characteristic. Moreover, the BiDMOS device of the invention reduces the junction capacitance between the base and the collector, resulting in a transistor with excellent switching operation characteristics.

Furthermore, in the BiDMOS device, if the gate of the DMOS transistor and the base of the bipolar transistor are electrically connected and a connection point therebetween is used as an input terminal of the device, the output current thereof may be modulated in response to either an input current or an input voltage.

What is claimed is:

1. A semiconductor device in which a bipolar transistor and a DMOS (double diffused MOS) transistor are formed on a semiconductor substrate, and device comprising:
   a semiconductor substrate having a first conductivity type;
   a collector formed in said substrate, said collector having a second conductivity type;
   an epitaxial layer having said second conductivity type formed on said collector and said substrate, wherein said epitaxial layer is isolated by an adjacent device isolation region;
   a vertical trench formed in said epitaxial layer down to a top portion of said collector, said trench having a sidewall and a bottom, wherein said trench separates said epitaxial layer into a first epitaxial region and a second epitaxial region;
   a gate insulation layer formed on said sidewall and bottom of said trench;
   a gate polysilicon layer formed on said gate insulation layer, said gate polysilicon layer filling in said trench;
   a base region formed in said first epitaxial region;
   a drain sink formed in said second epitaxial region and down into said collector;
   a drain region formed in said drain sink; and
   an emitter region formed in said base region.

2. A semiconductor device as in claim 1, wherein a base electrode is electrically connected to said base region, an emitter electrode is electrically connected to said emitter region, a gate electrode is electrically connected to said gate polysilicon layer, and a drain electrode is electrically connected to said drain region.

3. A semiconductor device as in claim 2, wherein said base region is formed on a portion of said gate insulation layer adjacent to said first epitaxial region.

4. A semiconductor device as in claim 2, wherein said drain region and said drain sink are formed on a portion of said gate insulation layer adjacent to said second epitaxial region.

5. A semiconductor device as in claim 4, wherein said base region is formed on a portion of said gate insulation layer adjacent to said first epitaxial region.

6. A semiconductor device as in claim 2, wherein said electrodes are formed of metal.

7. A semiconductor device as in claim 5, wherein said electrodes are formed of metal.

8. A semiconductor device as in claim 6, wherein said substrate is a p-type.

9. A semiconductor device as in claim 7, wherein said substrate is a p-type.

10. A semiconductor device as in claim 8, wherein said base electrode and said gate electrically connected.

11. A semiconductor device as in claim 9, wherein said base electrode and said gate are electrically connected.

12. A semiconductor device as in claim 2, wherein said emitter region functions as a source of a DMOS transistor and said drain electrode functions as a collector electrode of a bipolar transistor.

13. A semiconductor device as in claim 5, wherein said emitter region functions as a source of a DMOS transistor and said drain electrode functions as a collector electrode of a bipolar transistor.

14. A semiconductor device in which a bipolar transistor and a DMOS (double diffused MOS) transistor are formed on a semiconductor substrate, and device comprising:
   a semiconductor substrate having a first conductivity type corresponding to a p-type;
   a collector formed in said substrate, said collector having a second conductivity type;
   an epitaxial layer formed on said collector and said substrate, said epitaxial layer having said second conductivity type;
   a vertical trench formed in said epitaxial layer down to a top portion of said collector, said trench having a sidewall and a bottom, wherein said trench separates said epitaxial layer into a first epitaxial region and a second epitaxial region;
   a gate insulation layer formed on said sidewall and bottom of said trench;
   a gate polysilicon layer formed on said gate insulation layer, said gate polysilicon layer filling in said trench;
   a base region formed in said first epitaxial region;
   a drain sink formed in second epitaxial region and down into said collector;
   a drain region formed in said drain sink;
   an emitter region formed in said base region; and
   a base electrode electrically connected to said base region, an emitter electrode electrically connected to said emitter region, a gate electrode electrically connected to said gate polysilicon layer, and a drain electrode electrically connected to said drain region.

15. A semiconductor device as in claim 14, wherein said base electrode and said gate are electrically connected.

16. A semiconductor device as in claim 14, wherein said emitter region functions as a source of a DMOS transistor and said drain electrode functions as a collector electrode of a bipolar transistor.

17. A semiconductor device as in claim 14, wherein said epitaxial layer is isolated by an adjacent device isolation region.

* * * * *